United States Patent
Shih

(10) Patent No.: US 9,531,386 B2
(45) Date of Patent: Dec. 27, 2016

(54) TRANSMITTER HAVING VOLTAGE DRIVER AND CURRENT DRIVER

(71) Applicant: TAIWAN SEMICONDUCTOR MANUFACTURING COMPANY, LTD., Hsinchu (TW)

(72) Inventor: Yu-Nan Shih, Taichung (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/698,099

(22) Filed: Apr. 28, 2015

(65) Prior Publication Data
US 2015/0229308 A1 Aug. 13, 2015

Related U.S. Application Data

(63) Continuation of application No. 14/015,183, filed on Aug. 30, 2013, now Pat. No. 9,041,439.

(51) Int. Cl.
*H03B 1/00* (2006.01)
*H03K 3/00* (2006.01)
*H03K 19/0185* (2006.01)
*H03K 19/00* (2006.01)
*H04L 25/00* (2006.01)

(52) U.S. Cl.
CPC .. *H03K 19/018528* (2013.01); *H03K 19/0005* (2013.01); *H04L 25/00* (2013.01)

(58) Field of Classification Search
USPC ..... 327/108–112, 379, 389, 391; 326/22–27, 326/81–87
See application file for complete search history.

(56) References Cited

U.S. PATENT DOCUMENTS

| | | | |
|---|---|---|---|
| 6,369,621 B1* | 4/2002 | Tinsley | H04L 25/0272 327/108 |
| 6,566,911 B1* | 5/2003 | Moyer | H03K 19/018585 326/112 |
| 6,917,546 B2 | 7/2005 | Matsui | |
| 7,154,295 B2 | 12/2006 | Choe | |
| 7,443,231 B2 | 10/2008 | Chang | |
| 7,525,357 B2 | 4/2009 | Kuzmenka | |
| 7,570,085 B2* | 8/2009 | Ishikawa | H03K 17/168 327/108 |
| 7,639,746 B2 | 12/2009 | Cornelius et al. | |
| 7,764,082 B2 | 7/2010 | Yan et al. | |
| 7,969,206 B2 | 6/2011 | Ito | |
| 8,564,352 B2 | 10/2013 | Agrawal et al. | |

(Continued)

*Primary Examiner* — Brandon S Cole
(74) *Attorney, Agent, or Firm* — Hauptman Ham, LLP

(57) ABSTRACT

A circuit includes a first power node that carries a first supply voltage having a first voltage level and a second power node that carries a second supply voltage having a second voltage level less than the first voltage level. A voltage driver has a first plurality of transistors, an input node for an input signal, and an output node, and a current driver has a second plurality of transistors. The current driver injects or extracts an adjustment current into or out of the output node. The first plurality of transistors and the second plurality of transistors electrically couple the output node and the current driver to the first power node in response to the input signal being at a first logic state, and electrically decouple the output node and the current driver from the first power node in response to the input signal being at a second logic state.

20 Claims, 5 Drawing Sheets

(56) References Cited

U.S. PATENT DOCUMENTS

| | | | |
|---|---|---|---|
| 2007/0001715 A1 | 1/2007 | Brown et al. | |
| 2008/0143427 A1* | 6/2008 | Kuzmenka | H04L 25/0278 327/541 |
| 2008/0224768 A1 | 9/2008 | Yen et al. | |
| 2009/0091358 A1* | 4/2009 | Chauhan | H03K 19/018521 327/108 |
| 2009/0243655 A1* | 10/2009 | Nascimento | G06F 13/4072 326/83 |
| 2011/0304362 A1* | 12/2011 | Matsubara | G05F 3/262 327/109 |
| 2013/0169322 A1* | 7/2013 | Shen | H03K 3/78 327/109 |
| 2013/0328591 A1* | 12/2013 | Chen | H03K 19/094 326/83 |

\* cited by examiner

TRANSMITTER HAVING VOLTAGE DRIVER AND CURRENT DRIVER

PRIORITY CLAIM

The present application is a continuation of U.S. application Ser. No. 14/015,183, filed Aug. 30, 2013, which is incorporated herein by reference in its entirety.

BACKGROUND

A signal transmission system includes a transmitter, a receiver, and a channel connecting the transmitter and the receiver. For transmitting a signal along the channel having a predetermined intrinsic impedance, a voltage mode driver is usable as the transmitter and is capable of outputting a voltage signal having a voltage level changing between (a) one-half of a difference between a first supply voltage (having a voltage level VDD) and a second supply voltage (having a voltage level GND) and (b) the voltage level GND of the second supply voltage. Thus, a signal swing of the output signal is $$\frac{(VDD - GND)}{2}.$$

In some applications, two voltage mode drivers are used side by side to transmit a pair of differential signals, and the overall signal swing of the output different signals would be (VDD–GND). In some applications, the signal transmission system is designed to be in compliance with an industrial standard, where a defined range of output signal swing is also provided.

DESCRIPTION OF THE DRAWINGS

One or more embodiments are illustrated by way of example, and not by limitation, in the figures of the accompanying drawings, wherein elements having the same reference numeral designations represent like elements throughout.

DETAILED DESCRIPTION

Figure 1:
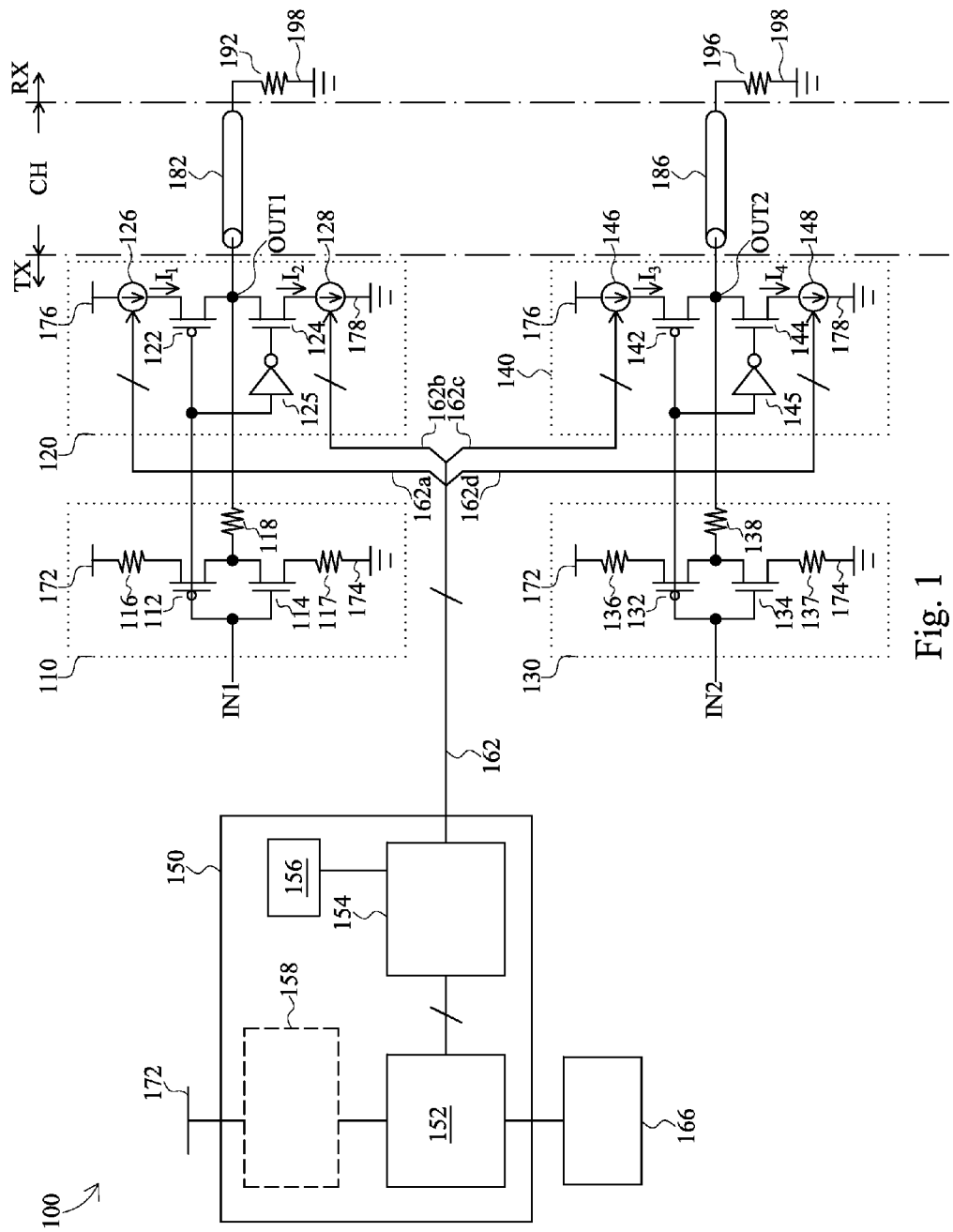
FIG. 1 is a circuit diagram of a signal transmission system in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

In some embodiments, output signal swing is determined based on a voltage level of a power supply voltage of a voltage driver and an adjustment current injected into or extracted from an output node of the voltage driver. The output signal swing is adjustable to have a predetermined signal swing by controlling an amount and direction of the adjustment current based on a measurement result of the voltage level of the power supply voltage.

FIG. 1 is a circuit diagram of a signal transmission system 100 in accordance with one or more embodiments. Signal transmission system 100 includes a transmitting portion (i.e., a transmitter) TX, a receiving portion (i.e., a receiver) RX, and a channel portion CH between transmitting portion TX and receiving portion RX.

Transmitting portion TX includes a first voltage driver 110, a first current driver 120 coupled with first voltage driver 110, a second voltage driver 130, a second current driver 140 coupled with second voltage driver 130, a control unit 150 coupled to first current driver 120 and second current driver 140 through bus 162, and a reference voltage unit 166 coupled to the control unit 150. Transmitting portion TX further includes a first power node 172, a second power node 174, a third power node 176, and a fourth power node 178. Channel portion CH includes a first channel 182 coupled to first voltage driver 110 and a second channel 186 coupled to second voltage driver 130. Receiving portion RX includes a first termination impedance 192 coupled to the first channel 182, a second termination impedance 196 coupled to the second channel 186, and a fifth power node 198 coupled to the first and second termination impedances 192 and 196.

First voltage driver 110 includes a P-type transistor 112, an N-type transistor 114, resistors 116, 117, and 118, an input node IN1, and an output node OUT1. P-type transistor 112 has a source coupled to first power node 172 through resistor 116. P-type transistor 112 has a drain coupled to a drain of N-type transistor 114. N-type transistor 114 has a source coupled to second power node 174 through resistor 117. Drains of transistors 112 and 114 are coupled to output node OUT1 through resistor 118. Gates of transistors 112 and 114 are coupled to input node IN1. In some embodiments, resistors 116, 117, and 118 are physical resistive devices. In some embodiments, one or more of resistors 116, 117, and 118 are not physical resistive devices. Rather, the one or more of resistors 116, 117, and 118 are used in the circuit diagram to represent resistance of transistors 112 and 114 and/or conductive lines of first voltage driver 110 observable from output node OUT1.

First power node 172 is configured to carry a first supply voltage having a first voltage level VDD. Second power node 174 is configured to carry a second supply voltage having a second voltage level VSS or ground GND less than the first voltage level VDD.

In some embodiments, first voltage driver 110 is configured to electrically couple output node OUT1 to first power node 172 when a first input signal at input node IN1 is at a first logic state, such as a logic low state. In some embodiments, first voltage driver 110 is configured to electrically couple output node OUT1 to second power node 174 when the first input signal at input node IN1 is at a second logic state, such as a logic high state.

In some embodiments, channel 182 has a predetermined intrinsic impedance $Z_0$. In some embodiments, first voltage driver 110 is configured to have an output impedance matching the predetermined intrinsic impedance $Z_0$. In some embodiments, output resistance of first voltage driver 110 when the first input signal at input node IN1 is at the logic low state that is equal to a resistance of the combination of resistor 116, resistor 118, and a turned-on resistance of transistor 112 in series. In some embodiments, output resistance of first voltage driver 110 when the first input signal at input node IN1 is at the logic high state that is equal to a resistance of the combination of resistor 117, resistor 118, and a turned-on resistance of transistor 114 in series.

First current driver 120 includes a P-type transistor 122, an N-type transistor 124, an inverter 125, a first set of current sources 126, and a second set of current sources 128. P-type transistor 122 has a source coupled to third power node 176 through first set of current sources 126. P-type transistor 122 has a drain coupled to a drain of N-type transistor 124. N-type transistor 124 has a source coupled to fourth power node 178 through second set of current sources 128. Drains of transistors 122 and 124 are coupled to output node OUT1. In some embodiments, third power node 176 is configured to carry a third supply voltage having a third voltage level VDDA, or to be coupled to the first power node 172. Fourth power node 178 is configured to carry a fourth supply voltage having a fourth voltage level VSSA or ground GND less than the third voltage level VDDA, or to be coupled to the second power node 174.

Inverter 125 has an input coupled to input node IN1 and an output. P-type transistor 122 has a gate coupled to input node IN1, and N-type transistor 124 has a gate coupled to output of inverter 125.

Figure 2A:
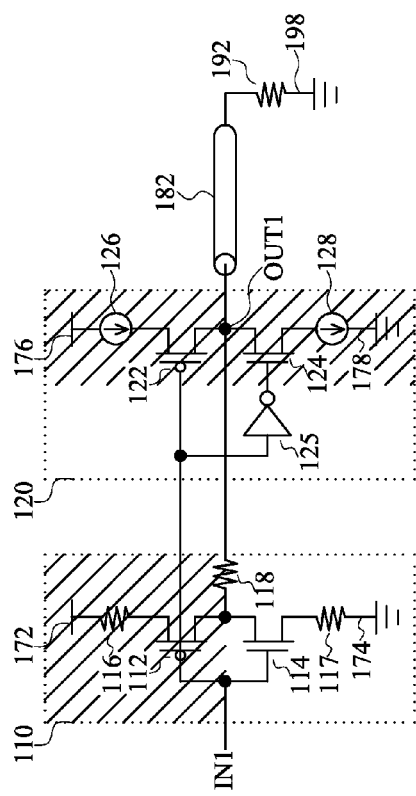
FIG. 2A is a circuit diagram of a voltage driver and a current driver having an input signal at a logic high state in accordance with one or more embodiments.

FIG. 2A is a circuit diagram of a voltage driver 110 and a current driver 120 having an input signal at a logic high state in accordance with one or more embodiments. Components similar to those depicted in FIG. 1 are denoted with the same reference numbers.

When the first signal is at the logic high state, transistors 122 and 124 are turned off (depicted as being covered by shadowed regions), and first current driver 120 is electrically decoupled from output node OUT1. Also, transistor 112 is turned off (depicted as being covered by a shadowed region), transistor 114 is turned on, and thus output node OUT1 is electrically coupled to power node 174. If power nodes 174, 178, and 198 have a voltage level set to be 0V, a voltage level at the output node OUT1 is 0V.

Figure 2B:
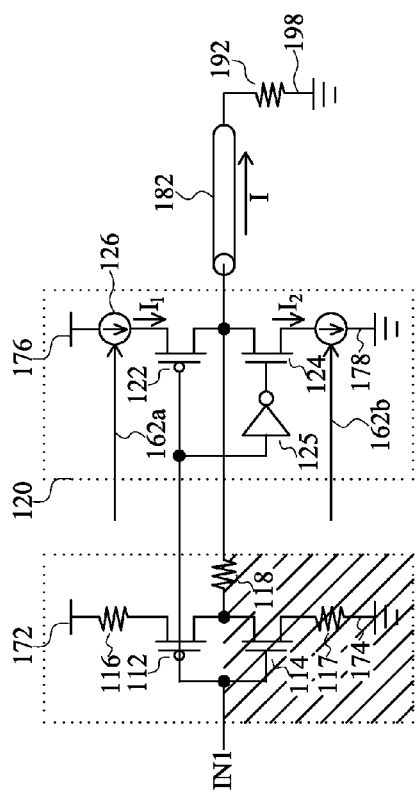
FIG. 2B is a circuit diagram of a voltage driver and a current driver having an input signal at a logic low state in accordance with one or more embodiments.

FIG. 2B is a circuit diagram of a voltage driver 110 and a current driver 120 having an input signal at a logic low state in accordance with one or more embodiments. Components similar to those depicted in FIG. 1 are denoted with the same reference numbers.

When the first signal is at the logic low state, transistors 122 and 124 are turned on, and first set of current sources 126 and second set of current sources 128 are electrically coupled to output node OUT1. Also, transistor 112 is turned on and transistor 114 is turned off (depicted as being covered by a shadowed region), and thus output node OUT1 is electrically coupled to power node 172.

Under this scenario, first current driver 120 is configured to inject or extract a first adjustment current into or out of output node OUT1. For example, when transistors 122 and 124 are turned on, first set of current sources 126 is coupled to output node OUT1 and configured to inject a first current $I_1$ into output node OUT1 responsive to a first set of control signals from the control unit 150 through bus 162a. In some embodiments, when transistors 122 and 124 are turned on, second set of current sources 128 is coupled to output node OUT1 and configured to extract a second current $I_2$ from output node OUT1 responsive to a second set of control signals from the control unit 150 through bus 162b. Therefore, an amount of adjustment current I injected into output node OUT1 equals $(I_1-I_2)$, where a positive value of I denotes the injection of adjustment current and negative values of I denotes extraction of adjustment current. In some embodiments, one of current $I_1$ or $I_2$ is set to 0 for minimizing power consumption of the first current driver 110.

First termination impedance 192 of receiving portion RX is used to model the input impedance of a receiver. In some embodiments, first termination impedance 192 also has an input impedance matching the predetermined intrinsic impedance $Z_0$. In some embodiments, if $R_0$ represents a real part of the predetermined intrinsic impedance $Z_0$, I represents the amount of current injected into output node OUT1 by first current driver 120, and the voltage level VSS or ground GND is set to be 0V, the voltage level at output node OUT1 has a voltage level of $$\left(\frac{VDD}{2} + \frac{IR_0}{2}\right).$$

Therefore, as depicted in FIG. 2A and FIG. 2B, when voltage driver 110, current driver 120, channel 182, and termination impedance 192 are configured as advanced above, the voltage level at output node OUT1 has a signal swing equal to $$\left(\frac{VDD}{2} + \frac{IR_0}{2}\right).$$

The signal swing at output node OUT1 is adjustable through controlling adjustment current I.

As depicted in FIG. 1, second voltage driver 130 and second current driver 140 are configured in a manner that would have substantially similar functionality as that of first voltage driver 110 and first current driver 120 illustrated above.

Second voltage driver 130 includes a P-type transistor 132, an N-type transistor 134, resistors 136, 137, and 138, an input node IN2, and an output node OUT2. P-type transistor 132 has a source coupled to first power node 172 through resistor 136. P-type transistor 132 has a drain coupled to a drain of N-type transistor 134. N-type transistor 134 has a source coupled to second power node 174 through resistor 137. Drains of transistors 132 and 134 coupled to output node OUT2 through resistor 138. Gates of transistors 132 and 134 are coupled to input node IN2. In some embodiments, resistors 136, 137, and 138 are physical resistive devices. In some embodiments, one or more of resistors 136, 137, and 138 are used in the circuit diagram to represent resistance of transistors 132 and 134 and/or conductive lines of first voltage driver and thus are not physical resistive devices.

In some embodiments, second voltage driver 130 is configured to electrically couple output node OUT2 to first power node 172 when a second input signal at input node IN2 is at the logic low state. In some embodiments, second voltage driver 130 is configured to electrically couple output node OUT2 to second power node 174 when the second input signal at input node IN2 is at the logic high state.

In some embodiments, channel 186 also has the predetermined intrinsic impedance $Z_0$. In some embodiments, second voltage driver 130 is configured to have an output resistance matching the predetermined intrinsic impedance $Z_0$ in a manner similar to that of first voltage driver 110.

Second current driver 140 includes a P-type transistor 142, an N-type transistor 144, an inverter 145, a third set of current sources 146, and a fourth set of current sources 148. P-type transistor 142 has a source coupled to third power node 176 through third set of current sources 146. P-type transistor 142 has a drain coupled to a drain of N-type transistor 144. N-type transistor 144 has a source coupled to fourth power node 178 through fourth set of current sources 148. Drains of transistors 142 and 144 coupled to output node OUT2. Inverter 145 has an input coupled to input node IN2 and an output. P-type transistor 142 has a gate coupled to input node IN2, and N-type transistor 144 has a gate coupled to output of inverter 145.

Similar to first current driver 120, second current driver 140 is configured to inject or extract a second adjustment current into or out of output node OUT2 when a second input signal at input node IN2 is at the logic low state. Under this circumstance, in some embodiments, third set of current sources 146 is configured to inject a third current $I_3$ into output node OUT2 responsive to a third set of control signals from the control unit 150 through bus 162c. In some embodiments, fourth set of current sources 148 is configured to extract a fourth current $I_4$ from output node OUT4 responsive to a second set of control signals from the control unit 150 through bus 162d.

In some embodiments, the second adjustment current is set to have the same amount of current flowing along consistent direction (i.e., injecting or extracting adjustment currents) as those of the first adjustment current. In some embodiments, the amount of adjustment current I injected into output node OUT2 equals $(I_3-I_4)$, where a positive value of I denotes the injection of adjustment current and negative values of I denotes extraction of adjustment current. In some embodiments, one of current $I_3$ or $I_4$ is set to 0 for minimizing power consumption of the second current driver.

In some embodiments, first set of current sources 126 and third set of current sources 146 have similar configurations, and current $I_1$ and $I_3$ are set to be substantially the same. In some embodiments, second set of current sources 128 and fourth set of current sources 148 have similar configurations, and current $I_2$ and $I_4$ are set to be substantially the same.

If $R_0$ represents a real part of the predetermined intrinsic impedance $Z_0$, I represents the amount of current injected into output node OUT2 by second current driver 140, and the voltage level VSS or ground GND is set to be 0V, the voltage level at second output node OUT2 has a signal swing equal to $$\left(\frac{VDD}{2} + \frac{IR_0}{2}\right).$$

In some embodiments, first voltage driver 110 and second voltage driver 130 are configured to transmit a signal in a differential manner. Therefore, first input signal and second input signal are a pair of differential signals and have logically complementary states. Accordingly, in some embodiments, first voltage driver 110, first current driver 120, second voltage driver 130, and second current driver 140 is set to have a signal swing at output nodes OUT1 and OUT2 equal to $(VDD+IR_0)$.

Control unit 150 has an analog-to-digital converter (ADC) 152 and a current adjusting unit 154. Control unit 150 is also coupled to power node 172 in order to receive the first supply voltage and reference voltage unit 166 in order to receive a reference voltage. ADC 152 is configured to generate a measurement result of the first voltage level of the first supply voltage based on the reference voltage. Current adjusting unit 154 is configured to output a set of control signals to the first current driver 120 to set the amount and the direction of the first adjustment current and to the second current driver 140 to set the amount and the direction of the second adjustment current according to the measurement result.

For example, when ADC 152 returns a measurement result of the first voltage level of the first supply voltage being VDD, and the signal transmission system 100 is set to have a predetermined differential mode output swing of Vx, current adjusting unit 154 is capable of setting current $I_1$, $I_2$, $I_3$, and $I_4$ to provide adjustment current I such that:

$Vx=(VDD+IR_0)$, and thus $IR_0=(Vx-VDD)$.

In some embodiments, current adjusting unit 154 determines the control signals for controlling the current drivers 120 and 140 according to a predetermined look-up table using the measurement result VDD and the predetermined output signal swing Vx as indices.

Control unit 150 further has a storage unit 156 configured to store the set of control signals and/or the look-up table. Therefore, the measurement performed by ADC 152 and the determination of the set of control signals performed by current adjusting unit 154 need not be continuously and/or recursively executed. In some embodiments, control unit 150 is configured to perform measurement of the first supply voltage and determination of the set of control signals when signal transmission system 100 is powered on, is reset according to an external reset instruction, or is requested to re-execute the measurement and determination of the set of control signals according to an external calibration instruction.

In some embodiments, control unit 150 has a voltage divider 158 configured to receive and convert the first supply voltage from power node 172 into a divided voltage signal and output the divided voltage signal to ADC 152. In some embodiments, reference voltage unit 166 is configured to output the reference voltage based on a bandgap reference voltage. In some embodiments, ADC 152 is capable of converting a voltage signal having a voltage level between 0V to the reference voltage to a digital code.

In some embodiments, if the voltage level at power node 172 is close or above the reference voltage, voltage divider 158 then is usable to output the divided voltage signal that would fall within the applicable operation range of ADC 152. In some embodiments, ADC 152 is capable of converting only a voltage signal that has a voltage level falling within a smaller voltage range within the range of 0V to the reference voltage to the digital code, because the voltage level of power node 172 outside the smaller voltage range would cause current drivers 120 and 140 to be inoperable. In some embodiments, ADC 152 is capable of output digital codes that have a resolution of 5 to 30 mV each quantization step. In some embodiments, ADC 152 is configured to output a binary value having 3 bits to 7 bits.

Figure 3A:
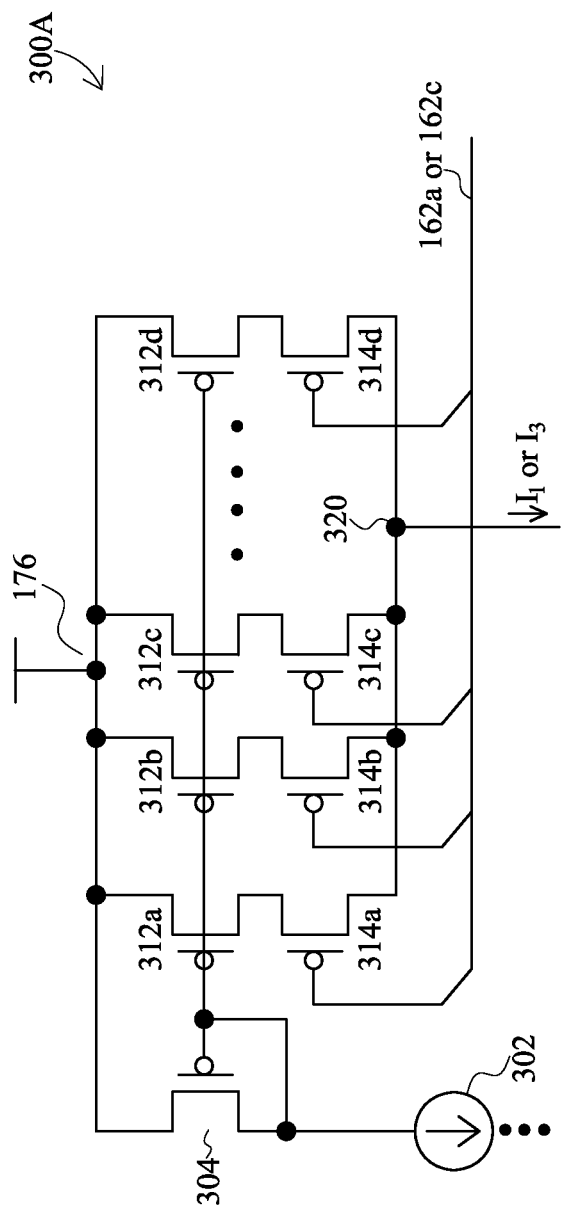
FIG. 3A is a circuit diagram of a set of current sources usable in a current driver in accordance with one or more embodiments.

FIG. 3A is a circuit diagram of a set of current sources 300A usable as a set of current sources 126 or 146 in a current driver 120 or 140 in accordance with one or more embodiments. Current sources 300A includes a reference current source 302, a diode-connected P-type transistor 304, a plurality of P-type transistors 312a, 312b, 312c, and 312d, and a plurality of switching devices 314a, 314b, 314c, and 314d.

Reference current source 302 is configured to provide a constant reference current. Sources of transistors 312a, 312b, 312c, and 312d and transistor 304 are coupled to power node 176. Gates of transistors 312a, 312b, 312c, and 312d and transistor 304 are coupled together. Transistors 312a, 312b, 312c, and 312d and transistor 304 are configured as a current mirror array such that transistors 312a, 312b, 312c, and 312d are capable of outputting corresponding current having predetermined current levels based on mirroring of the reference current from reference current source 302. In some embodiments, the corresponding current levels are determined according to channel width/length ratios of transistors 312a, 312b, 312c, and 312d and transistor 304. In some embodiments, transistors 312a, 312b, 312c, and 312d are configured to output the same amount of current. In some embodiments, transistors 312a, 312b, 312c, and 312d are configured to output different amounts of current. In some embodiments, there are more or fewer than four transistors 312a, 312b, 312c, and 312d for mirroring currents based on transistor 304.

The plurality of switching devices 314a, 314b, 314c, and 314d connects corresponding transistors 312a, 312b, 312c, and 312d to node 320 and is set to be turned on or off based on control signals from control unit 150 through bus 162a or 162c. In some embodiments, switching devices 314a, 314b, 314c, and 314d are also formed by P-type transistors. In some embodiments, each transistor 312a, 312b, 312c, and 312d is configured to output the same amount of current, and the set of control signals for controlling gates of transistors 312a, 312b, 312c, and 312d represents a value in a thermometer code format. In some embodiments, gates of transistor 312a, 312b, 312c, and 312d are coupled as groups of transistors each represent a corresponding power of two time(s) a unit current, and the set of control signals for controlling corresponding groups of transistors 312a, 312b, 312c, and 312d represents a value in a binary code format.

Figure 3B:
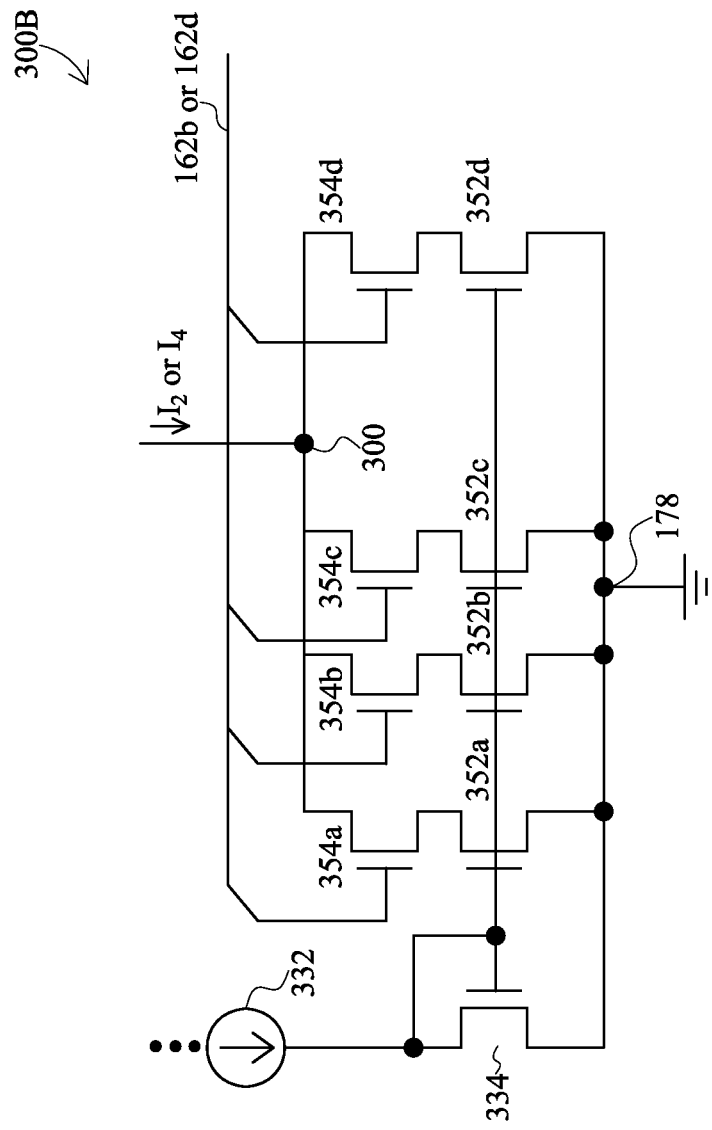
FIG. 3B is a circuit diagram of another set of current sources usable in a current driver in accordance with one or more embodiments.

FIG. 3B is a circuit diagram of another set of current sources 300B usable as a set of current sources 128 or 148 in a current driver 120 or 140 in accordance with one or more embodiments. Current sources 300B includes a reference current source 332, a diode-connected N-type transistor 334, a plurality of N-type transistors 352a, 352b, 352c, and 352d, and a plurality of switching devices 354a, 354b, 354c, and 354d.

Reference current source 332 is configured to provide a constant reference current. Sources of transistors 352a, 352b, 352c, and 352d and transistor 334 are coupled to power node 178. Gates of transistors 352a, 352b, 352c, and 352d and transistor 334 are coupled together. Transistors 352a, 352b, 352c, and 352d and transistor 334 are configured as a current mirror array such that transistors 352a, 352b, 352c, and 352d are capable of outputting corresponding current having predetermined current levels based on mirroring of the reference current from reference current source 332. In some embodiments, the corresponding current levels are determined according to channel width/length ratios of transistors 352a, 352b, 352c, and 352d and transistor 334. In some embodiments, transistors 352a, 352b, 352c, and 352d are configured to output the same amount of current. In some embodiments, transistors 352a, 352b, 352c, and 352d are configured to output different amounts of current. In some embodiments, there are more or fewer than four transistors 352a, 352b, 352c, and 352d for mirroring currents based on transistor 334.

The plurality of switching devices 354a, 354b, 354c, and 354d connects corresponding transistors 352a, 352b, 352c, and 352d to node 360 and is set to be turned on or off based on control signals from control unit 150 through bus 162b or 162d. In some embodiments, switching devices 354a, 354b, 354c, and 354d are also formed by N-type transistors. In some embodiments, each transistor 352a, 352b, 352c, and 352d is configured to output the same amount of current, and the set of control signals for controlling gates of transistors 352a, 352b, 352c, and 352d represents a value in a thermometer code format. In some embodiments, gates of transistor 352a, 352b, 352c, and 352d are coupled as groups of transistors each represent a corresponding power of two time(s) a unit current, and the set of control signals for controlling corresponding groups of transistors 352a, 352b, 352c, and 352d represents a value in a binary code format.

Figure 4:
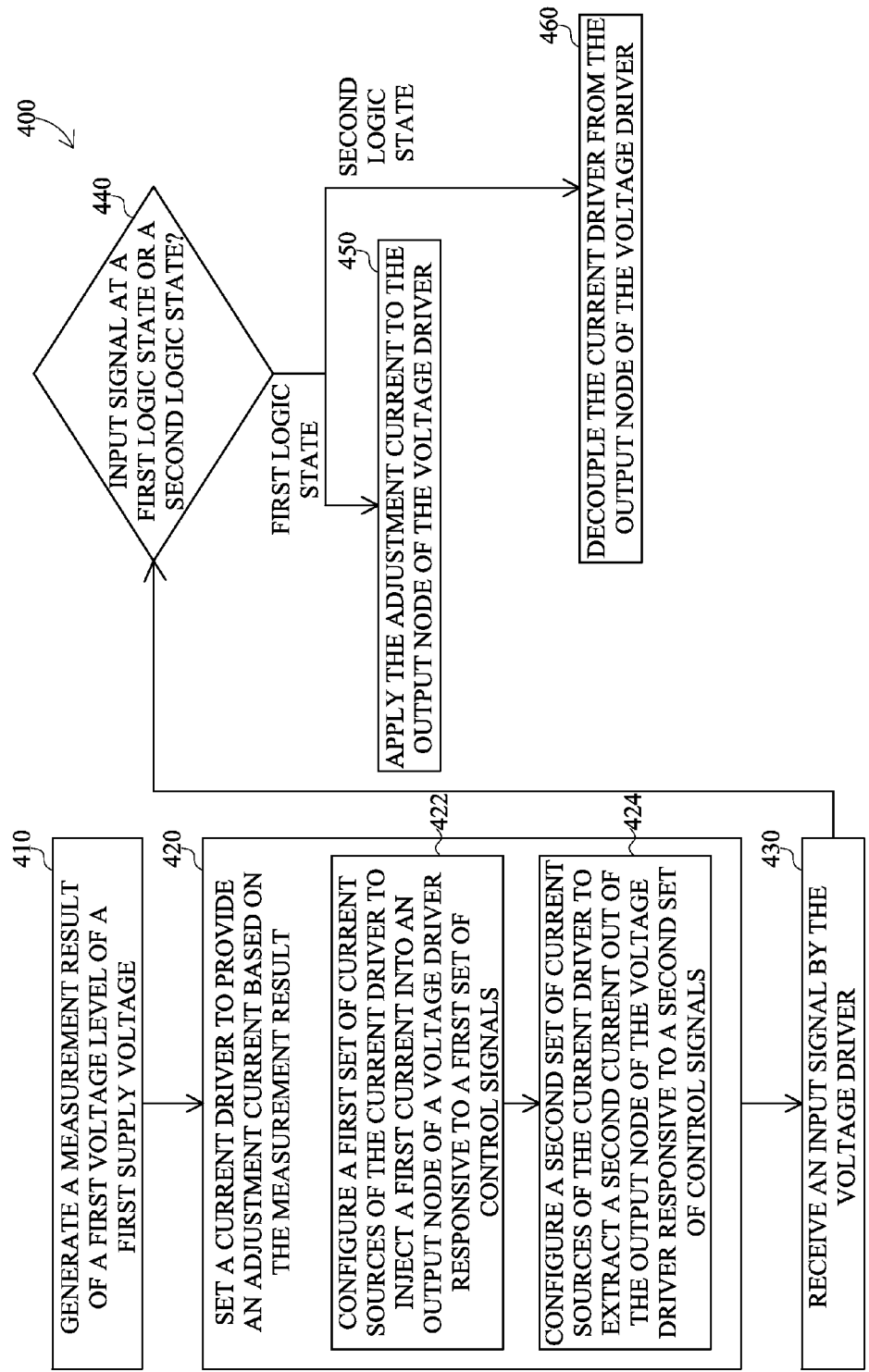
FIG. 4 is a flow chart of a method of operating a transmitter in accordance with one or more embodiments.

FIG. 4 is a flow chart of a method 400 of operating a transmitter in accordance with one or more embodiments. It is understood that additional operations may be performed before, during, and/or after the method 400 depicted in FIG. 4, and that some other processes may only be briefly described herein.

As depicted in FIG. 1 and FIG. 4, in operation 410, control unit 150 generates a measurement result of a first voltage level of a first supply voltage at power node 172, such as VDD. In some embodiments, ADC 152 receives the first supply voltage at power node 172 and output a digital code representing the measurement result VDD based on a reference voltage from reference voltage unit 166. In some embodiments, voltage divider 158 receives the first supply voltage at power node 172 and converts the first supply voltage into a divided voltage signal. ADC 152 then receives the divided voltage generate the measurement result based on the divided voltage signal.

As depicted in FIG. 1 and FIG. 4, in operation 420, control unit 150 sets a current driver, such as current driver 120 and/or current driver 140 to provide an adjustment current based on the measurement result VDD. In some embodiments, operation 420 includes operation 422, where a set of current sources 126 of current driver 120 and/or a set of current sources 146 of current driver 140 is configured to inject a first current into the corresponding output node OUT1 or OUT2 responsive to a first set of control signals. In some embodiments, operation 420 further includes operation 424, where a set of current sources 128 of current driver 120 and/or a set of current sources 148 of current driver 140 is configured to extract a second current from the corresponding output node OUT1 or OUT2 responsive to a second set of control signals.

In some embodiments, the control signals for controlling the current drivers 120 and 140 are stored in a storage unit 156. In some embodiments, current adjusting unit 154 determines the control signals for controlling the current drivers 120 and 140 according to a predetermined look-up table using the measurement result VDD and a predetermined output signal swing as indices as illustrated above.

As depicted in FIG. 1 and FIG. 4, in operation 430, an input signal is received by voltage driver 110 and/or 130. In some embodiments, voltage driver 110 or 130 is configured to electrically couple a corresponding output node OUT1 or OUT2 to power node 172 when the input signal is at a logic low state, and to electrically couple the corresponding output node OUT1 or OUT2 to power node 174 when the input signal is at a logic high state.

As depicted in FIG. 1 and FIG. 4, in operation 440, current driver 120 or 140 determines if the corresponding input signal is at the logic high state or the logic low state. As depicted in FIG. 2B and FIG. 4, in operation 450, when the corresponding input signal is at the logic low state, the adjustment current from current driver 120 or 140 is applied to the output node OUT1 or OUT2. As depicted in FIG. 2A and FIG. 4, in operation 460, when the corresponding input signal is at the logic high state, current driver 120 or 140 electrically decoupling the current driver from the output node OUT1 or OUT2.

Therefore, according to one or more embodiments of the present application, output signal swing is set to a predetermined signal swing as set forth by a predetermined industrial standard. Also, variation of the power supply voltage of the corresponding voltage driver is capable of being compensated, and the output signal swing is calibrated, using the ADC 152 and the corresponding current driver.

In some embodiments, a circuit comprises a first power node configured to carry a first supply voltage having a first voltage level and a second power node configured to carry a second supply voltage having a second voltage level less than the first voltage level. The circuit further comprises a first voltage driver comprising a first plurality of transistors, a first input node configured to receive a first input signal, and a first output node, and a first current driver comprising a second plurality of transistors. The first current driver is configured to inject or extract a first adjustment current into or out of the first output node. The first plurality of transistors and the second plurality of transistors are configured to electrically couple the first output node and the first current driver to the first power node in response to the first input signal being at a first logic state, and to electrically decouple the first output node and the first current driver from the first power node in response to the first input signal being at a second logic state.

In some embodiments, a circuit comprises a node, a first power node configured to carry a first supply voltage having a first voltage level, a second power node configured to carry a second supply voltage having a second voltage level, and a third power node configured to carry a third supply voltage having a third voltage level less than the first voltage level and the second voltage level. The circuit further comprises a current driver comprising a first plurality of switches configured to electrically couple and decouple the current driver from the node, and a second plurality of switches. The second plurality of switches is configured to control a current flow between the node and at least one of the second power node and the third power node, the second set of switches being responsive of a set of control signals determined based on a measurement result of the first voltage level.

In some embodiments, a method of operating a circuit comprises setting a current driver to provide an adjustment current based on a predetermined output voltage value, receiving an input signal at an input node, and electrically coupling the current driver and a first power node to an output node and applying the adjustment current to the output node when an input signal at the input node is at a first logic state. The method further comprises electrically decoupling the current driver and the first power node from the output node when the input signal at the input node is at a second logic state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
a first power node configured to carry a first supply voltage having a first voltage level;
a second power node configured to carry a second supply voltage having a second voltage level less than the first voltage level;
a first voltage driver comprising a first plurality of transistors, a first input node configured to receive a first input signal, and a first output node; and
a first current driver comprising a second plurality of transistors, the first current driver configured to inject or extract a first adjustment current into or out of the first output node,
wherein the first plurality of transistors and the second plurality of transistors are configured to electrically couple the first output node and the first current driver to the first power node in response to the first input signal being at a first logic state, and to electrically decouple the first output node and the first current driver from the first power node by turning off the second plurality of transistors in response to the first input signal being at a second logic state.

2. The circuit of claim 1, further comprising a control unit configured to set an amount and a direction of the first adjustment current based on a predetermined output voltage value.

3. The circuit of claim 2, wherein the control unit is further configured to set the amount and the direction of the first adjustment current based on a measurement result of the first voltage level.

4. The circuit of claim 2, wherein the control unit is further configured to set the amount and the direction of the first adjustment current based on an output impedance of the first voltage driver.

5. The circuit of claim 4, wherein the first voltage driver is configured to have the output impedance matching a predetermined intrinsic impedance of a channel.

6. The circuit of claim 2, wherein:
the control unit is configured to generate a set of control signals; and
the first current driver further comprises a third plurality of transistors configured to respond to the control signals to set the amount and the direction of the first adjustment current.

7. The circuit of claim 1, further comprising:
a second voltage driver comprising a third plurality of transistors, a second input node configured to receive a second input signal, and a second output node; and
a second current driver comprising a fourth plurality of transistors, the second current driver configured to inject or extract a second adjustment current into or out of the second output node, wherein the third plurality of transistors and the fourth plurality of transistors are configured to electrically couple the second output node and the second current driver to the first power node in response to the second input signal being at the first logic state, and to electrically decouple the second output node and the second current driver from the first power node in response to the second input signal being at the second logic state.

8. The circuit of claim 7, further comprising a control unit configured to set an amount and a direction of the first adjustment current and an amount and a direction of the second adjustment current based on a predetermined voltage swing value for a differential voltage between the first output node and the second output node.

9. The circuit of claim 8, wherein the control unit is further configured to set the amount and the direction of the first adjustment current and the amount and the direction of the second adjustment current based on a measurement result of the first voltage level.

10. The circuit of claim 1, wherein the first plurality of transistors is further configured to electrically couple the first output node to the second power node in response to the first input signal being at the second logic state.

11. A circuit, comprising:
a node;
a first power node configured to carry a first supply voltage having a first voltage level;
a second power node configured to carry a second supply voltage having a second voltage level;
a third power node configured to carry a third supply voltage having a third voltage level less than the first voltage level and the second voltage level;
a current driver comprising:
a first plurality of switches configured to electrically couple and decouple the current driver from the node; and
a second plurality of switches configured to control a current flow between the node and at least one of the second power node and the third power node, the second set of switches being responsive of a set of control signals determined based on a measurement result of the first voltage level.

12. The circuit of claim 11, wherein the first power node and the second power node are the same power node and the first voltage level equals the second voltage level.

13. The circuit of claim 11, wherein the second plurality of switches is configured to control a first current mirror array between the second power node and the node and to control a second current mirror array between the node and the third power node.

14. The circuit of claim 13, wherein each current mirror of at least one of the first current mirror array or the second current mirror array is configured to output the same current.

15. The circuit of claim 13, wherein a first current mirror and a second current mirror of at least one of the first current mirror array or the second current mirror array are configured to output different currents.

16. The circuit of claim 11, further comprising an analog-to-digital converter (ADC) configured to generate the measurement result of the first voltage level.

17. A method of operating a circuit, the method comprising:
setting a current driver to provide an adjustment current based on a predetermined output voltage value;
receiving an input signal at an input node;
electrically coupling the current driver and a first power node to an output node and applying the adjustment current to the output node when an input signal at the input node is at a first logic state; and
electrically decoupling the current driver and the first power node from the output node when the input signal at the input node is at a second logic state.

18. The method of claim 17, further comprising generating a measurement result of a first voltage level of a first supply voltage carried on the first power node, wherein setting the current driver to provide the adjustment current further comprises setting the current driver to provide the adjustment current based on the measurement result.

19. The method of claim 17, wherein the predetermined output voltage value is a voltage swing value for a differential voltage between the output node and a second output node.

20. The method of claim 17, wherein setting the current driver to provide the adjustment current further comprises setting the current driver by using stored control signals.

* * * * *